United States Patent [19]
Scheraga

[11] Patent Number: 5,834,964
[45] Date of Patent: Nov. 10, 1998

[54] LATERAL PNP FAST TURN-ON CIRCUIT

[75] Inventor: William J. Scheraga, Warwick, R.I.

[73] Assignee: Cherry Semiconductor Corporation, East Greenwich, R.I.

[21] Appl. No.: 867,627

[22] Filed: Jun. 2, 1997

[51] Int. Cl.[6] .................................................. H03K 17/04
[52] U.S. Cl. .......................... 327/376; 327/478; 327/484; 327/487; 327/374; 326/18
[58] Field of Search .................... 327/478, 482, 327/484, 485, 487, 374, 375, 376, 377; 326/17, 18

[56] References Cited

U.S. PATENT DOCUMENTS

| | | | |
|---|---|---|---|
| 3,766,414 | 10/1973 | Blackburn et al. | 307/297 |
| 3,784,844 | 1/1974 | McGrogan, Jr. | 307/270 |
| 3,825,774 | 7/1974 | Van Kessel et al. | 307/260 |
| 4,006,370 | 2/1977 | Erier | 307/300 |
| 4,564,769 | 1/1986 | Melamed | 307/300 |
| 4,588,904 | 5/1986 | Glogolja | 307/255 |
| 4,618,782 | 10/1986 | Lang et al. | 307/255 |
| 4,642,483 | 2/1987 | Tomita | 307/300 |
| 4,644,186 | 2/1987 | Sivasothy et al. | 307/300 |
| 4,777,387 | 10/1988 | Collins | 307/571 |
| 4,847,520 | 7/1989 | O'Neill et al. | 307/296.1 |
| 5,128,553 | 7/1992 | Nelson | 307/253 |
| 5,159,286 | 10/1992 | Ito | 330/260 |
| 5,546,045 | 8/1996 | Sauer | 327/484 |
| 5,625,312 | 4/1997 | Kawakami et al. | 327/483 |

OTHER PUBLICATIONS

"Turnoff Circuit", Norton, D.E., IBM Technical Disclosure Bulletin, vol. 7, No. 6, Nov. 1964.
"Inductor and emitter follower remove stroed charge to turn off 4 A in 20 ns", Burwen, Eric, Electronic Design, Sep. 1979.

*Primary Examiner*—Timothy P. Callahan
*Assistant Examiner*—Jung Ho Kim
*Attorney, Agent, or Firm*—Bromberg & Sunstein LLP

[57] ABSTRACT

A control circuit for providing fast turn on of a PNP transistor in which a capacitor charging current is boosted and provided to the base of the PNP transistor. An embodiment of the invention provides a current amplifier in parallel with a current source for coupling to the base of the PNP transistor. The PNP transistor is connected to a positive voltage supply. A capacitor is also coupled to the positive voltage supply for delivering a charging current amplifier. In a further embodiment, an NPN transistor has its base coupled to the capacitor and its collector coupled to the base of the PNP transistor for providing the drive current boost. A diode may be coupled to the capacitor for passing a discharge current to the capacitor when the PNP transistor is off and to block the capacitor current when the PNP transistor is being switched on. A PNP drive transistor may be coupled between the collector of the NPN transistor and the base of the PNP transistor.

31 Claims, 4 Drawing Sheets

LATERAL PNP FAST TURN-ON CIRCUIT

BACKGROUND OF THE INVENTION

The present invention relates to a control circuit for speeding up the turn on of a PNP transistor.

The transition time of a PNP transistor of a PNP driver is significantly slower than an NPN driver. PNP transistors are often used in high side drivers. In circuit applications that require a rapid turn on of a high side PNP driver, the inherent delay of the PNP transistor needs to be overcome. The rate at which the PNP transistor can be turned on is proportional to the level of base current supplied to it. The greater the level of base drive current, the faster the PNP transistor will turn on. The present invention addresses the need for a circuit that will increase the turn on slew rate of a PNP transistor and accomplishing the same within typical specification limits for a logic integrated circuit.

SUMMARY OF THE INVENTION

An embodiment of the present invention is directed to a PNP transistor control circuit in which a current amplifier is connected to the PNP output transistor in parallel with a switched current source. A capacitor is coupled between a positive voltage and an input node. The capacitor passes a current when a switching signal on the input node switches from one state to the other. In the embodiments shown herein, when the switching signal goes low, the capacitor current is fed into the current amplifier which provides a current boost for speeding up the turn on of the PNP output transistor. With the switching signal low, the current source provides the drive current to the PNP output transistor for maintaining the PNP output transistor in the on state.

The current amplifier of a presently preferred embodiment is an NPN transistor having an emitter coupled to the input node, a base coupled to the capacitor and a collector for providing the current boost to the PNP output transistor. The amplifier may further include a PNP drive transistor for further amplifying the current boost. The emitter of the PNP drive transistor is coupled to the base of the PNP output transistor. A base of the PNP drive transistor is coupled to the collector of the NPN transistor and the collector of the PNP drive transistor is coupled to ground. A current passing element is coupled between the capacitor and the input node. In a preferred embodiment, the current passing element is a diode for permitting current to discharge the capacitor when the switching signal is switched high and for blocking current from the capacitor when the switching signal is low. In this manner, when the switching signal is low, substantially all current from the capacitor is directed through the current amplifier to boost the drive current into the PNP output transistor.

Embodiments of the invention advantageously provide a current boost to accelerate turn on of the PNP output transistor. The current boost is transitory. Other objects and advantages of the invention will become apparent during the following description of the presently preferred embodiments of the invention taken in conjunction with the drawings.

DETAILED DESCRIPTION OF THE PREFERRED EMBODIMENTS

Figure 1:
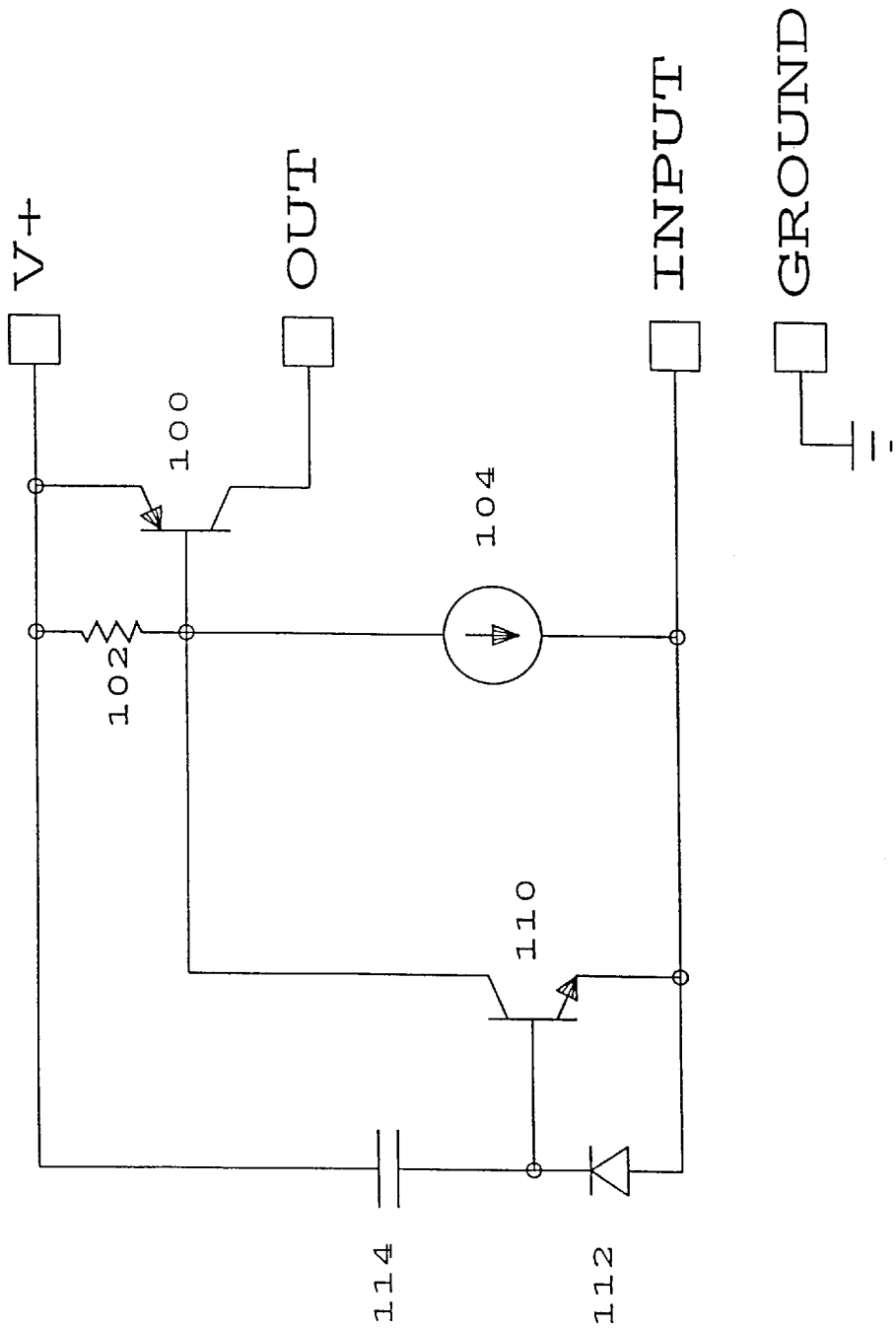
FIG. 1 is a schematic diagram of a first embodiment of the circuit of the invention.

Referring now to FIG. 1, a PNP output transistor 100 is controlled by an embodiment of the invention for an accelerated turn-on slew rate. A conventional base emitter resistor 102 aids in the turn off of the PNP transistor 100 and ensures that it remains off when no drive current is available. The emitter of the PNP transistor 100 is connected to a positive voltage supply line. The output is taken from the collector of the PNP transistor 100. The PNP transistor 100 is controlled through its base drive current.

Conventional control of the PNP transistor 100 is provided by a switching signal. In FIG. 1, the switching signal is applied to an input terminal. The conductors connected at the input terminal are referred to herein as an input node. Base drive current for the PNP transistor 100 is sourced through a current source 104. The current source 104 is off when the input node is high. When the input node switches low, current source 104 switches on and conducts a steady state current that will be at least at a sufficient level to cause the PNP transistor 100 to go into saturation.

In accordance with an aspect of the present invention, a current amplifier is added in parallel with the current source 104. In the embodiment of FIG. 1, an NPN transistor 110 acts as the current amplifier. It is desirable that the current amplifier provide a transitory current boost when the switching signal at the input node changes state, in the embodiment shown that is from high to low. The high state of the input switching signal has a voltage approximately equal to the positive voltage on the positive voltage supply line. The low state of the input switching signal has a voltage at or near ground. The current boost is used to accelerate the turn on of the PNP transistor 100. The base current to the NPN transistor 110 is provided through a capacitor 114. When the switching signal switches low, current flows through capacitor 114 to charge up the capacitor. This current goes into the base of the NPN transistor 110 where it is amplified by the NPN transistor 110. The amplified current flows through the collector-emitter circuit of the NPN transistor 110. Once the capacitor 114 is fully charged up, the base current to the NPN transistor 110 terminates. When the current boost to the base of the PNP transistor 100 stops, the base drive current for the PNP transistor 100 is provided solely through the current source 104.

A current passing element is included between the base and emitter of the NPN transistor 110 to provide a current path for discharging the capacitor 114, thereby resetting the capacitor for providing a current boost in the next high/low transition of the input switching signal. When the input switching signal goes high, current is allowed to pass through the current passing element to discharge the capacitor 114. The current passing element may be a resistor. However, in the preferred embodiment, the element is a diode 112. A resistor may be added in parallel with the diode. The diode 112 has the added advantage of blocking current flow in the opposite direction. Thus, when the input switching signal goes low, the charging current through the capacitor 114 substantially all goes into the base of the NPN transistor 110.

Figure 2:
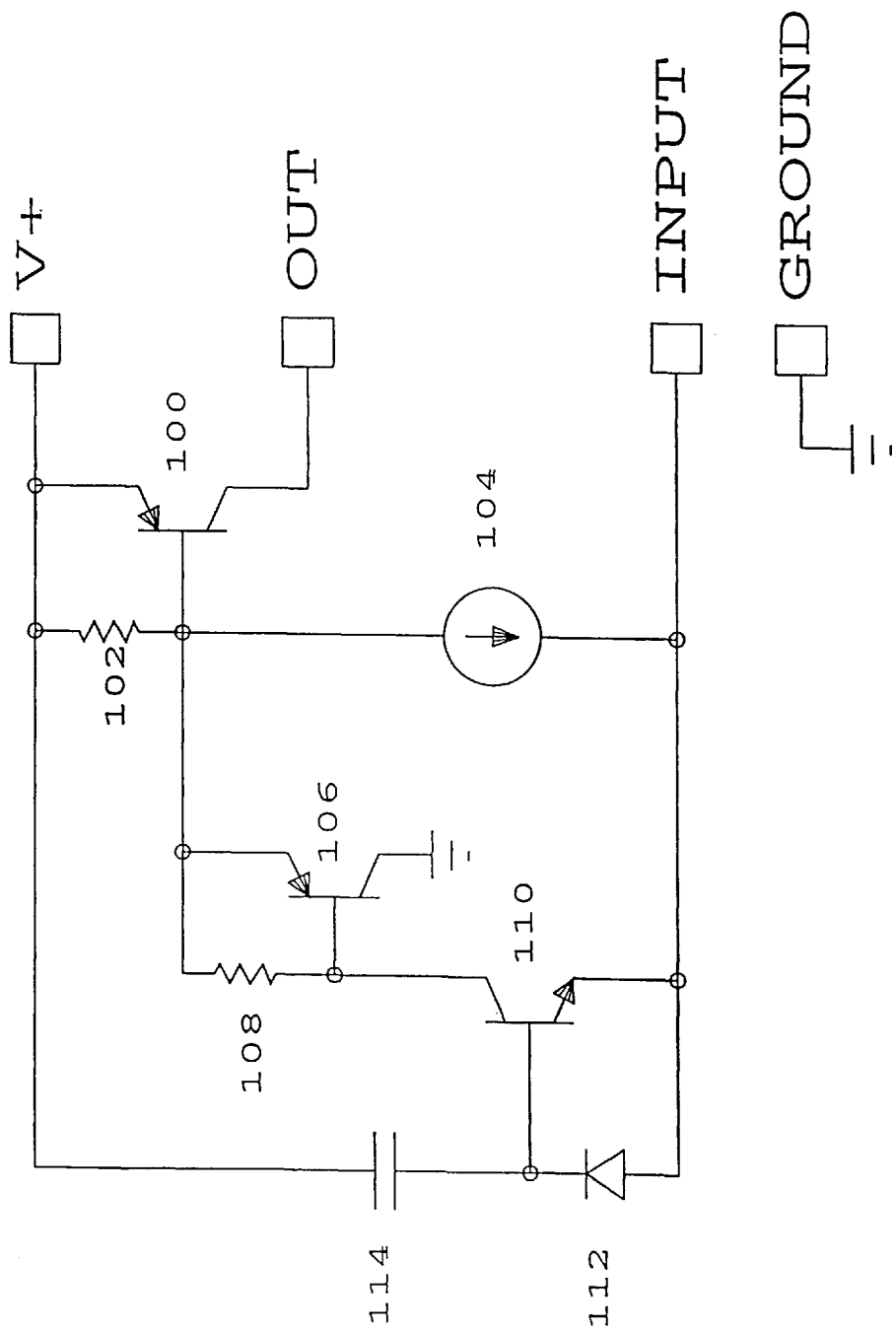
FIG. 2 is a schematic diagram of a second embodiment of the circuit of the invention.

FIG. 2 shows an alternate embodiment of the invention in which current amplification is provided both by the NPN transistor 110 and a PNP drive transistor 106. The PNP drive transistor has a base coupled to the collector of NPN transistor 110, a collector coupled to ground and an emitter coupled to the base of the PNP output transistor 100. When a switching signal on the input node switches low, the current source 104 is switched on and the current boost is provided through the current amplifier connected in parallel with the current source 104. The boost current is determined by the current amplification and the capacitor current level. The capacitor current level is determined by the equation I=C*dV/dT where I is the current flow in capacitor 114, C is the value of the capacitor 114, dV is the change in voltage across capacitor 114 and dT is the time duration of the input signal to go from the high to low state. For typical values of C=10 pf, dT=25 ns and dV=4 V, the capacitor current will be 1.6 ma. Substantially all of this current is directed to the base of the NPN transistor 110. This base current is multiplied by the beta of NPN transistor 110 to generate a collector current that drives the base of the PNP drive transistor 106. PNP drive transistor 106 may be provided with a conventional base-emitter resistor 108. The base drive current into PNP drive transistor 106 is theoretically multiplied by its beta and the resulting current from the emitter of the PNP drive transistor 106 drives the base of the PNP output transistor 100 and its associated base-emitter resistor 102. The collector current of the PNP drive transistor 106 flows into ground. The PNP drive transistor 106 thus provides additional amplification of the current boost to the base of the PNP transistor 100.

The base drive current to the PNP output transistor 100 which is provided through the current amplifier of NPN transistor 110 and PNP drive transistor 106, is of a short duration. For example, it may last only about 5 μs. After this time, the current source 104 continues to supply the base drive current to the PNP transistor 100 for as long as the input node remains in a low state. The capacitor 114 has a voltage of about 0 volts across it when the switching signal on the input node is high. When the switching signal on the input node is low, the voltage across capacitor 114 increases to about the positive voltage on the positive voltage supply line minus the Vbe of NPN transistor 110. For a positive voltage of 5 volts and a Vbe of 0.7 volts, the voltage across the capacitor will be about 4.3 volts.

After a period of time, the switching signal on the input node transitions from a low state to a high state in order to turn the PNP output transistor 100 off. As the switching signal on the input node changes to the high state, the current source 104 turns off and no base drive is available to the PNP transistor 100. During the low to high transition at the input node, current flows through the diode 112 to capacitor 114, discharging it from its high level down to about 0 volts. The capacitor is then ready to begin the next cycle.

It is well within the scope of this invention to alter the sizes of the components to change the response times. The capacitor current can be varied by changing the size of the capacitor. The resulting current that flows into the base of NPN transistor 110 is high enough to cause the NPN transistor to operate in a region where its collector current is limited by the physical size of its emitter rather than by the nominal beta of the transistor. Operating in this region, the available current from the collector of NPN transistor 110 can be set by fixing the emitter area to some particular value. A large area will result in more collector current and therefore a faster rate of turn on for the PNP transistor 100. Similarly, the emitter area of PNP drive transistor 106 will have an effect on the rate of turn on of the PNP output transistor 100. PNP transistors are not as efficient as NPN transistors. In other words, they have a lower current handling capability for an equal emitter area. Therefore, the PNP drive transistor 106 may need to be larger than the NPN transistor 110. Even if the PNP drive transistor 106 is not made too large, all of the collector current of NPN transistor 110 will flow through the base-emitter junction of the PNP drive transistor 106 and be available to drive the PNP output transistor 100. Thus, the main determinant of the turn-on rate of the PNP output transistor 100 is the emitter area of the NPN transistor 110. Secondary determinants of the rate of turn on are the area of the emitter of the PNP transistor 106 and the value of capacitor 114. The size of the PNP output transistor 100 is also a factor in determining the rate of turn on. Because the base drive is set mainly by device areas and not transistor betas, the rate of turn on should be relatively insensitive to die temperature and wafer processing variations.

In all the circuits shown herein, using an input signal transition of only about ten nanoseconds, the additional current boost as seen at the collector of the PNP output transistor 100 will last for about 5 microseconds. This prolonging of excess collector current (above the maximum collector current resulting from the base drive set up by current source 104) is due mainly to the nature of PNP transistors built using standard bipolar processing. Due to the excess stored base charge in PNP output transistor 100 caused by the high base drive current applied by the current boost, the excess output current from the collector of PNP transistor 100 will persist until this excess stored charge is dissipated.

Figure 3:
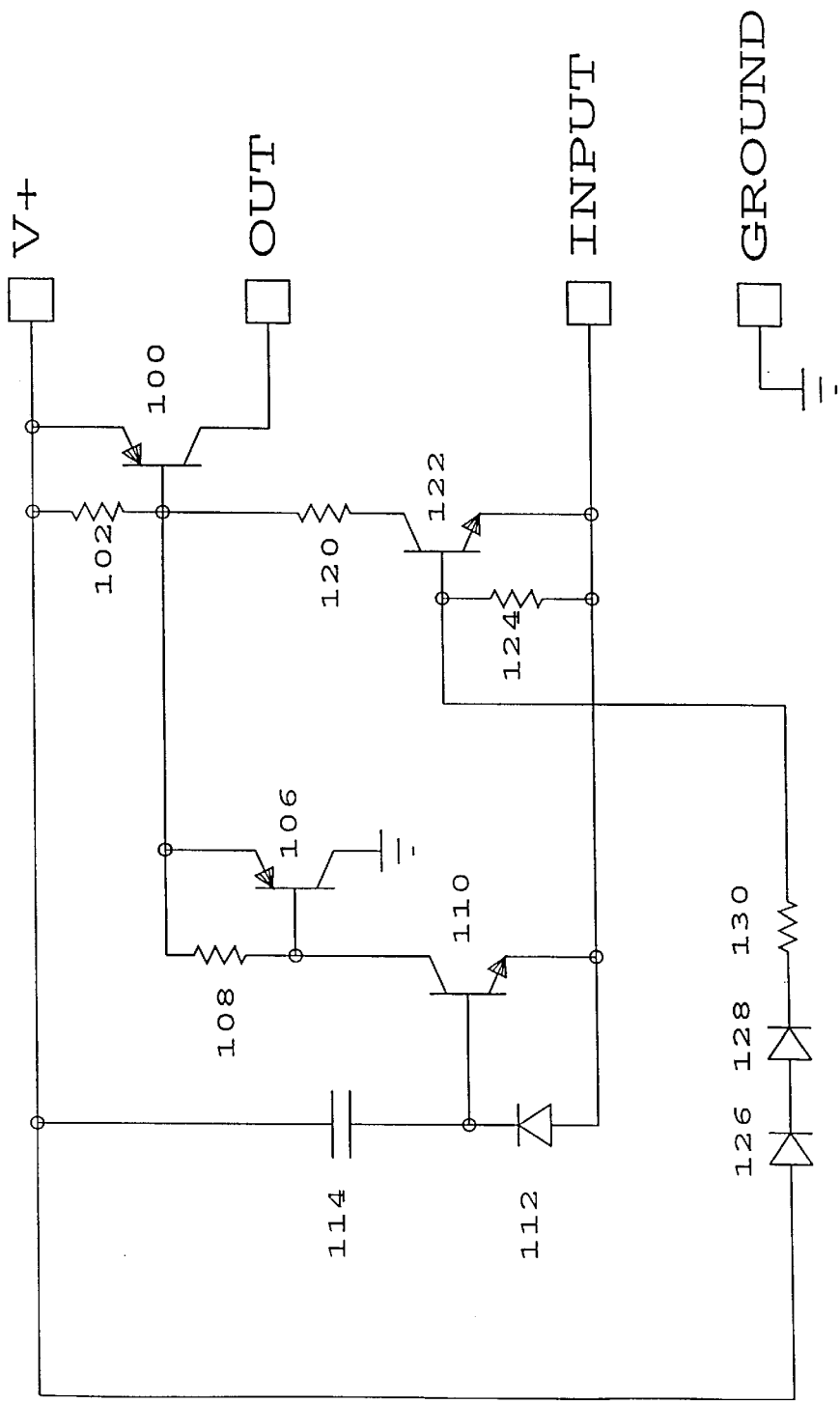
FIG. 3 is a schematic diagram of a third embodiment of the circuit of the invention.

A presently preferred current source for use in the circuit of FIGS. 1 and 2 is shown in FIG. 3. An NPN switching transistor 122 goes into saturation when the switching signal on the input node goes low. It pulls a current determined in large part by the value of resistor 120. Resistor 120 is connected to the collector of the NPN switching transistor 122. The switching transistor 122 may be provided with a base-emitter resistor 124.

The trip point for switching the transistor 122 on or off is set with the assistance of one or more semiconductor junctions coupled between the positive voltage supply line and the base of switching transistor 122. In the embodiment of FIG. 3, two diodes 126, 128 are connected in series between the positive voltage supply line and the base of switching transistor 122. A resistor 130, connected in series with the diodes 126, 128, also contributes to the trip point. In the embodiment of FIG. 3, the turn-on voltage of the switching transistor 122 is equal to the positive voltage on the voltage supply line minus the sum of the voltage across diode 126, the voltage across diode 128, the Vbe of the switching transistor and the value of resistor 130 times the Vbe of the switching transistor divided by the value of base-emitter resistor 124.

Figure 4:
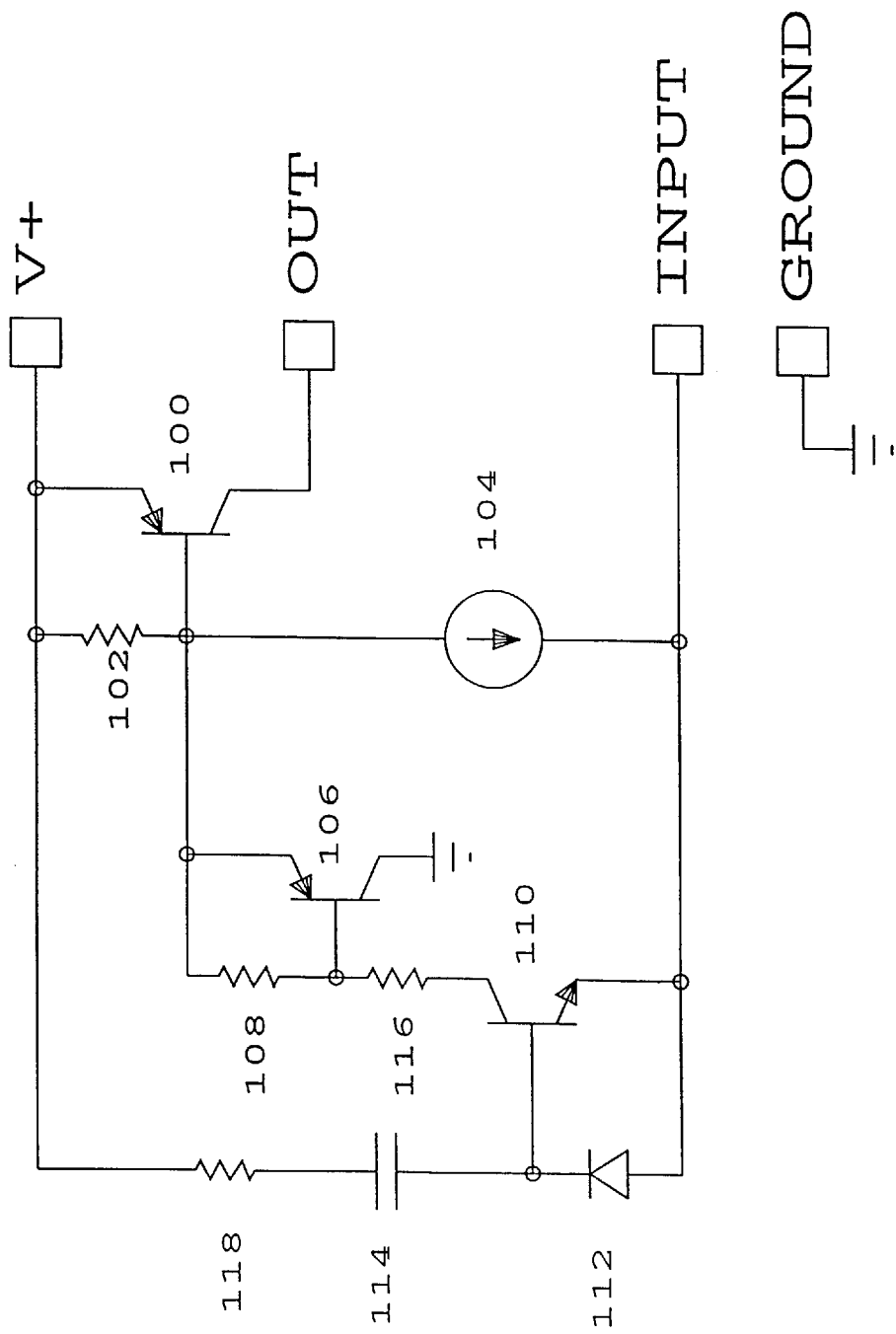
FIG. 4 is a schematic diagram of a fourth embodiment of the circuit of the invention.

Other modifications that can be made to any of the embodiments of the invention are shown in FIG. 4. A resistor may be coupled between the collector of the NPN transistor 110 and the base of the PNP output transistor 100 to set a limit to the maximum current applied to the base of the PNP output transistor 100. In the embodiment of FIG. 4, a resistor 116 is connected between the collector of NPN transistor 110 and the base of PNP drive transistor 106. In this location, the resistor 116 sets a limit to the maximum current applied to the base of PNP drive transistor 106. This, in turn, can impact the limit on the current to the base of the PNP output transistor 100. An alternative location for the resistor would be to place it between the emitter of the PNP drive transistor 106 and the base of the PNP output transistor 100 where it would directly limit the current to the base of the PNP output transistor 100. The resistor coupled between the collector of the NPN transistor 110 and the base of the PNP output transistor 100 would introduce a temperature coefficient to the base drive current of the PNP output transistor 100. In certain applications or circumstances, this may be desirable.

An additional modification is shown in which a resistor 118 is added in series with the capacitor 114. Resistor 118 would have the effect of prolonging the time period of capacitor charging current being applied to the base of NPN transistor 110. Time duration of the capacitor charging current would be determined by the RC time constant of resistor 118 and capacitor 114.

It should be understood that various changes and modifications to the preferred embodiments described above will be apparent to those skilled in the art. For example, the components may be arranged so that the capacitor current is a discharging current instead of a charging current. The switching signal may be provided to an input node that lacks an input terminal. These and other changes can be made without departing from the spirit and scope of the invention and without diminishing its attendant advantages. It is, therefore, intended that such changes and modifications be covered by the following claims.

I claim:

1. A PNP transistor control circuit with fast turn on comprising:
    a voltage supply line for providing a positive voltage to the PNP transistor;
    a capacitor coupled between said voltage supply line and an input node, said capacitor passing a capacitor current when a switching signal on the input node switches from a first state to a second state;
    a current source, coupled between a base of the PNP transistor and the input node, for driving the PNP transistor when the switching signal is in the second state; and
    a current amplifier, coupled to the base of the PNP transistor in parallel with said current source and coupled to said capacitor, for amplifying current from said capacitor to provide a current boost that speeds up the turning on of the PNP transistor.

2. The control circuit of claim 1 wherein said current amplifier comprises an NPN transistor having a base coupled to said capacitor, an emitter coupled to the input node and a collector coupled to the base of the PNP transistor.

3. The control circuit of claim 1 further comprising a current passing element coupled to said capacitor to provide a current to discharge said capacitor when the input switching signal switches to the first state.

4. The control circuit of claim 3 wherein said current passing element comprises a diode connected between said capacitor and the node.

5. The control circuit of claim 1 wherein said current amplifier comprises a PNP drive transistor, having an emitter coupled to the base of the PNP transistor, a base coupled to said capacitor and a collector coupled to ground.

6. The control circuit of claim 5 further comprising a first resistor connected between the emitter and the base of said PNP drive transistor.

7. The control circuit of claim 1 wherein said current source comprises an NPN transistor having an emitter connected to the input node, a base and a collector coupled to the base of the PNP transistor.

8. The control circuit of claim 7 further comprising at least one semiconductor junction coupled between said voltage supply line and the base of said NPN transistor for setting a trip point voltage for said NPN transistor.

9. The control circuit of claim 1 further comprising a resistor coupled between said current amplifier and the base of the PNP transistor to limit drive current into the base of the PNP transistor.

10. The control circuit of claim 1 further comprising a resistor connected in series with said capacitor.

11. The control circuit of claim 1 wherein the first state is high and the second state is low.

12. A PNP transistor control circuit with fast turn on comprising:
    a voltage supply line for providing a positive voltage to the PNP transistor;
    an NPN transistor having a collector coupled to the base of the PNP transistor, a base and an emitter coupled to an input node;
    a current source, responsive to a switching signal on the input node, coupled to a base of the PNP transistor; and
    a capacitor coupled between the base of said NPN transistor and said voltage supply line, said capacitor passing a current to the base of said NPN transistor when the switching signal switches from a first state to a second state and said NPN transistor amplifying the current from said capacitor to speed up the PNP transistor as it turns on.

13. The control circuit of claim 12 further comprising a current passing element coupled to said capacitor to provide a current to discharge said capacitor when the switching signal switches to the first state.

14. The control circuit of claim 13 wherein said current passing element comprises a diode connected between the base and the emitter of said NPN transistor.

15. The control circuit of claim 12 further comprising a PNP drive transistor, having an emitter coupled to the base of the PNP transistor, a base coupled to the collector of said NPN transistor and a collector coupled to ground, for further amplifying the current boost.

16. The control circuit of claim 15 further comprising a first resistor connected between the emitter and the base of said PNP drive transistor.

17. The control circuit of claim 16 further comprising a second resistor coupled between the collector of said first NPN transistor and the base of said PNP drive transistor.

18. The control circuit of claim 12 wherein said current source comprises a switching transistor having an emitter coupled to the input node, a base and a collector coupled to the base of the PNP transistor.

19. The control circuit of claim 18 further comprising at least one semiconductor junction coupled between said voltage supply line and the base of said switching transistor for setting a trip point voltage for said switching transistor.

20. The control circuit of claim 12 further comprising a resistor coupled between the collector of said NPN transistor and the base of the PNP transistor to limit drive current into the base of the PNP transistor.

21. The control circuit of claim 12 further comprising a resistor connected in series with said capacitor.

22. The control circuit of claim 12 wherein the first state is high and the second state is low.

23. A PNP transistor control circuit with fast turn on comprising:
    a voltage supply line for providing a positive voltage to the PNP transistor;
    a PNP drive transistor, having an emitter coupled to the base of the PNP transistor, a base and a collector coupled to ground;
    an NPN transistor having a collector coupled to the base of the PNP drive transistor, an emitter coupled to an input node and a base;

a current source coupled to a base of the PNP transistor for driving the PNP transistor in response to a switching signal on the input node; and a capacitor coupled between the base of said NPN transistor and said voltage supply line, said capacitor delivering a transitory current to the base of said NPN transistor when the switching signal switches low and wherein said NPN transistor amplifies the transitory current and said PNP drive transistor delivers a current boost to the base of the PNP transistor to speed up the PNP transistor as it turns on.

24. The control circuit of claim 23 further comprising a current passing element coupled to said capacitor to provide a current to discharge said capacitor when the switching signal switches high.

25. The control circuit of claim 24 wherein said current passing element comprises a diode connected between the base and the emitter of said NPN transistor.

26. The control circuit of claim 25 further comprising a first resistor connected between the emitter and the base of said PNP drive transistor.

27. The control circuit of claim 26 further comprising a second resistor coupled between the collector of said NPN transistor and the base of said PNP drive transistor.

28. The control circuit of claim 25 wherein said current source comprises a switching transistor having an emitter connected to the input node, a base and a collector coupled to the base of the PNP transistor.

29. The control circuit of claim 28 further comprising at least one semiconductor junction coupled between said voltage supply line and the base of said switching transistor for setting a trip point voltage for said switching transistor.

30. The control circuit of claim 25 further comprising a resistor connected in series with said capacitor.

31. The control circuit of claim 23 further comprising a resistor coupled between the collector of said NPN transistor and the base of the PNP transistor to limit drive current into the base of the PNP transistor.

* * * * *